(12) United States Patent
Vines et al.

(10) Patent No.: US 11,653,480 B1
(45) Date of Patent: May 16, 2023

(54) METHODS AND APPARATUS FOR CONTROLLING THE ENVIRONMENT OF ELECTRONIC SYSTEMS IN VEHICLES

(71) Applicant: Nuro, Inc., Mountain View, CA (US)

(72) Inventors: James Nicholas Vines, San Francisco, CA (US); Jonathan David Beck, Mountain View, CA (US); Grant Yuan Emmendorfer, San Jose, CA (US); Andrew Bryce Braum, Los Gatos, CA (US)

(73) Assignee: Nuro. Inc., Mountain View, CA (US)

( * ) Notice: Subject to any disclaimer, the term of this patent is extended or adjusted under 35 U.S.C. 154(b) by 269 days.

(21) Appl. No.: 17/217,575

(22) Filed: Mar. 30, 2021

Related U.S. Application Data

(60) Provisional application No. 63/004,992, filed on Apr. 3, 2020.

(51) Int. Cl.
| | |
|---|---|
| *H05K 7/20* | (2006.01) |
| *G06F 1/20* | (2006.01) |
| *H01L 23/473* | (2006.01) |
| *B60R 16/023* | (2006.01) |
| *B60H 1/00* | (2006.01) |

(52) U.S. Cl.
CPC ..... *H05K 7/20872* (2013.01); *H05K 7/20281* (2013.01); *B60H 2001/00307* (2013.01); *B60R 16/0231* (2013.01); *G06F 1/20* (2013.01); *G06F 2200/201* (2013.01); *H01L 23/473* (2013.01); *H05K 7/20254* (2013.01); *H05K 7/20881* (2013.01)

(58) Field of Classification Search
CPC ... G06F 1/20; G06F 2200/201; H01L 23/473; H05K 7/20254; H05K 7/20872; H05K 7/20881; H05K 7/20927; B60H 2001/00307; B60R 16/0231
See application file for complete search history.

(56) References Cited

U.S. PATENT DOCUMENTS

| | | | | |
|---|---|---|---|---|
| 4,712,158 | A * | 12/1987 | Kikuchi | H01L 23/4332 257/E23.091 |
| 2010/0314094 | A1 * | 12/2010 | Hall | G05D 23/19 700/282 |
| 2016/0183408 | A1 * | 6/2016 | Sutherland | F25B 49/02 62/93 |
| 2019/0171258 | A1 * | 6/2019 | Rice | H01L 23/427 |

* cited by examiner

*Primary Examiner* — Lionel Nouketcha

(57) ABSTRACT

According to one aspect, an apparatus includes a first system that generates heat, and a cooling arrangement. The cooling arrangement cools the first system, and includes a coolant source and a distribution arrangement. The coolant source provides a coolant in a first state that is distributed by the distribution arrangement to absorb the heat. The cooling arrangement includes a control arrangement and a heating arrangement. The control arrangement maintains the coolant in the first state at least a set point, the set point being a temperature that is above a dew point, by determining when to activate the heating arrangement to warm the coolant in the first state and, when it is determined by the control arrangement that the heating arrangement is to be activated, activating the heating arrangement to warm the coolant in the first state to maintain the temperature of the coolant at the set point.

17 Claims, 17 Drawing Sheets

METHODS AND APPARATUS FOR CONTROLLING THE ENVIRONMENT OF ELECTRONIC SYSTEMS IN VEHICLES

CROSS-REFERENCE TO RELATED APPLICATION

This application claims the benefit of priority under 35 U.S.C. § 119 to U.S. Provisional Patent Application No. 63/004,992, filed Apr. 3, 2020, entitled "METHODS AND APPARATUS FOR CONTROLLING THE ENVIRONMENT OF ELECTRONIC SYSTEMS IN VEHICLES," which is incorporated herein by reference in its entirety.

TECHNICAL FIELD

The disclosure relates to providing systems which reduce adverse effects in electronic systems present in vehicles. More particularly, the disclosure relates to reducing effects of humidity, compensation, and temperature on electronic systems such as compute systems.

BACKGROUND

Vehicles such as autonomous vehicles often operate in environments which may cause the vehicles to suffer adverse effects. For example, if an electronic system such as a compute system in an autonomous vehicle becomes overheated, the electronic system may suffer from performance issues. Similarly, if an electronic system in a vehicle is subjected to humidity or condensation, the electronic system may suffer from performance issues as well as physical issues, e.g., electrical components may short out when in contact with moisture.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
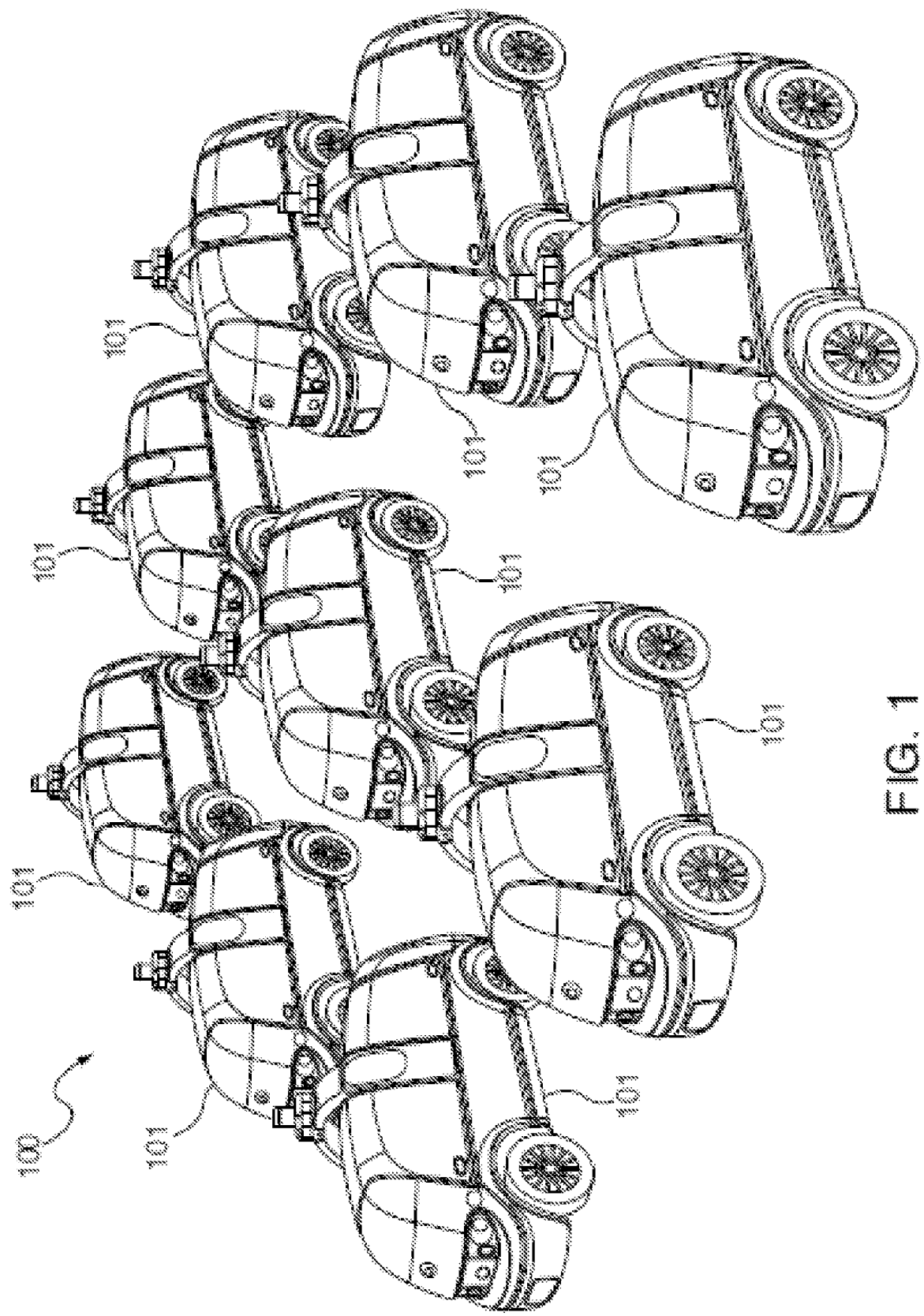
FIG. 1 is a diagrammatic representation of an autonomous vehicle fleet in accordance with an embodiment.

An autonomous vehicle is provided with cooling systems arranged to provide cooling to electronic systems such as compute systems. In one embodiment, a cooling system includes a heat exchanger which operates to cool a heat load within an enclosure by providing a cooled airflow in the enclosure while absorbing heat that is subsequently removed from the enclosure. In another embodiment, the temperature of a coolant of a cooling system that is provided to cool components of an autonomous vehicle may be finely controlled such that the temperature is above a dew point and, therefore, does not promote condensation which may compromise the performance of components.

According to one aspect, an apparatus includes a first system that generates heat, and a cooling arrangement. The cooling arrangement is configured to cool the first system, and includes a coolant source and a distribution arrangement, wherein the coolant source provides a coolant in a first state that is distributed by the distribution arrangement to absorb the heat. The cooling arrangement includes a control arrangement and a heating arrangement, the control arrangement configured to maintain the coolant in the first state at least a set point, the set point being a temperature that is above a dew point, by determining when to activate the heating arrangement to warm the coolant in the first state and, when it is determined by the control arrangement that the heating arrangement is to be activated, activating the heating arrangement to warm the coolant in the first state to maintain the temperature of the coolant at the set point.

According to another aspect, a vehicle includes a chassis, a first system, and a cooling arrangement. The first system is carried on the chassis, and is configured to enable the vehicle to operate autonomously, wherein the first system includes a compute system, the compute system being arranged to emanate a heat. The cooling arrangement is also carried on the chassis, and includes a reservoir, a heating arrangement, and a distribution arrangement. The reservoir is arranged to contain a liquid coolant, and the heating arrangement is arranged to warm the liquid coolant to a set point temperature. The set point temperature is above a dew point associated with an environment around the vehicle, and the liquid coolant at the set point temperature is arranged to be distributed by the distribution arrangement to absorb the heat.

According to yet another aspect, a method includes cooling a vehicle system and maintaining a coolant at a set point temperature. Cooling the vehicle system includes providing a coolant to a cooling arrangement, the cooling arrangement being arranged to provide the coolant at a set point temperature to cool the vehicle system, the set point temperature being above a dew point temperature associated with the vehicle system. Maintaining the coolant at the set point temperature includes determining when the coolant is to be warmed to maintain the coolant at the set point temperature. The method also includes warming the coolant to the set point temperature when it is determined that the coolant is to be warmed, wherein warming the coolant to the set point temperature creates at least a first amount of a warmed coolant. Finally, the method includes providing the first amount of the warmed coolant to the cooling arrangement to provide the cooling to the vehicle system after warming the coolant.

DESCRIPTION

Automotive electronic systems, e.g., compute systems, are often exposed to relatively harsh environments including, but not limited to including, high temperatures, low temperatures, and high humidity. When such systems operate in harsh environments or, more generally, environments which are not ideal, the performance of the systems may be compromised. As a result, the overall performance of a vehicle in which such systems are implemented may suffer.

Some automotive electronic systems are cooled using liquids, while some are cooled using air. Systems that are cooled using liquids may utilize a cooling device such as a liquid cold plate on which components of the systems are substantially mounted. While effective in cooling a system, the use of a cooling device may be impractical, as for example because there may be difficulties associated with mounting printed circuit boards, components, and/or other subassemblies onto a cooling device.

In some instances, cooling electronic systems may result in condensation within the electronic system. As will be appreciated by those skilled in the art, condensation may form when air cools, e.g., when air is cooled by a coolant or a liquid cold plate. The droplets of water formed when air cools may have an adverse effect on the components within the electronic system.

By providing systems which are capable of efficiently cooling components of an electronic system of a vehicle, and/or systems which allow the temperature of cooling, the effects of relatively harsh environments may be mitigated. For example, providing a heat exchanger mechanism within a sealed electronic enclosure that allows temperature to be substantially controlled within the enclosure may prevent overheating within the enclosure. In addition, increasing the temperature of a coolant in a sy stein to a temperature above a dew point temperature may substantially prevent condensation from forming within the system. Allowing for cooling and substantially preventing condensation may allow an electronic system to operate efficiently and accurately.

The vehicles in which a heat exchanger mechanism may be provided, and/or for which coolant temperatures may be maintained at a temperature above a dew point temperature, may be autonomous vehicles. An autonomous vehicle typically includes a compute system, or a computing system which allows the autonomous vehicle to operate autonomously, e.g., fully autonomously and/or semi-autonomously. Such autonomous vehicles may be part of an autonomous vehicle fleet.

Referring initially to FIG. 1, an autonomous vehicle fleet will be described in accordance with an embodiment. An autonomous vehicle fleet 100 includes a plurality of autonomous vehicles 101, or robot vehicles. Autonomous vehicles 101 are generally arranged to transport and/or to deliver cargo, items, and/or goods. Autonomous vehicles 101 may be fully autonomous and/or semi-autonomous vehicles. In general, each autonomous vehicle 101 may be a vehicle that is capable of travelling in a controlled manner for a period of time without intervention, e.g., without human intervention. As will be discussed in more detail below, each autonomous vehicle 101 may include a power system, a propulsion or conveyance system, a navigation module, a control system or controller, a communications system, a processor, and a sensor system.

Dispatching of autonomous vehicles 101 in autonomous vehicle fleet 100 may be coordinated by a fleet management module (not shown). The fleet management module may dispatch autonomous vehicles 101 for purposes of transporting, delivering, and/or retrieving goods or services in an unstructured open environment or a closed environment.

Figure 2:
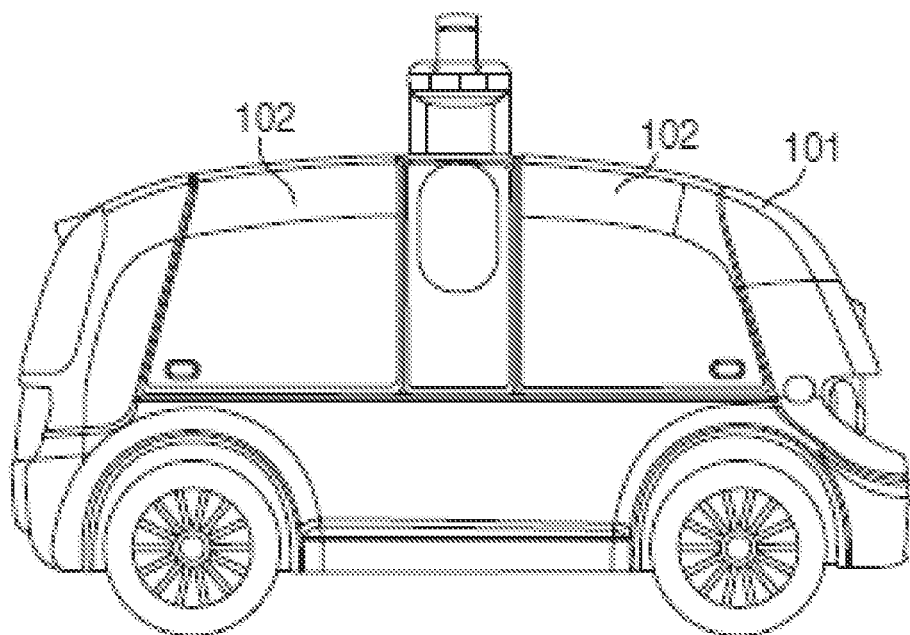
FIG. 2 is a diagrammatic representation of a side of an autonomous vehicle in accordance with an embodiment.

FIG. 2 is a diagrammatic representation of a side of an autonomous vehicle, e.g., one of autonomous vehicles 101 of FIG. 1, in accordance with an embodiment. Autonomous vehicle 101, as shown, is a vehicle configured for land travel. Typically, autonomous vehicle 101 includes physical vehicle components such as a body or a chassis, as well as conveyance mechanisms, e.g., wheels. In one embodiment, autonomous vehicle 101 may be relatively narrow, e.g., approximately two to approximately five feet wide, and may have a relatively low mass and relatively low center of gravity for stability. Autonomous vehicle 101 may be arranged to have a working speed or velocity range of between approximately one and approximately forty-five miles per hour (mph), e.g., approximately twenty-five miles per hour. In some embodiments, autonomous vehicle 101 may have a substantially maximum speed or velocity in range between approximately thirty and approximately ninety mph.

Autonomous vehicle 101 includes a plurality of compartments 102. Compartments 102 may be assigned to one or more entities, such as one or more customer, retailers, and/or vendors. Compartments 102 are generally arranged to contain cargo, items, and/or goods. Typically, compartments 102 may be secure compartments. It should be appreciated that the number of compartments 102 may vary. That is, although two compartments 102 are shown, autonomous vehicle 101 is not limited to including two compartments 102.

Figure 3:
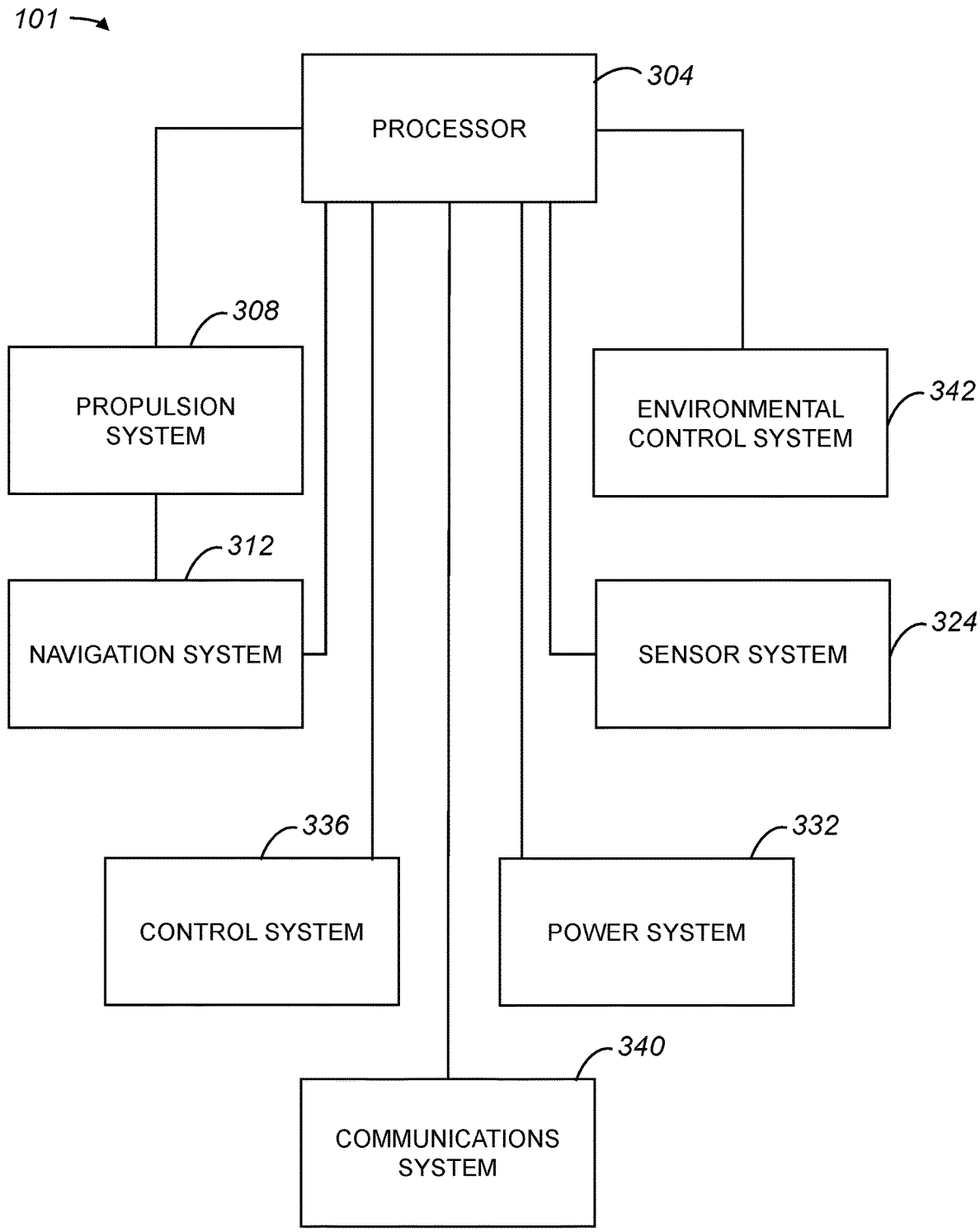
FIG. 3 is a block diagram representation of an autonomous vehicle in accordance with an embodiment.

FIG. 3 is a block diagram representation of an autonomous vehicle, e.g., autonomous vehicle 101 of FIG. 1, in accordance with an embodiment. An autonomous vehicle 101 includes a processor 304, a propulsion system 308, a navigation system 312, a sensor system 324, a power system 332, a control system 336, a communications system 340, and an environmental control system 342. It should be appreciated that processor 304, propulsion system 308, navigation system 312, sensor system 324, power system 332, communications system 340, and environmental control system 342 are all coupled directly or indirectly to a chassis or body of autonomous vehicle 101.

Processor 304 is arranged to send instructions to and to receive instructions from or for various components such as propulsion system 308, navigation system 312, sensor system 324, power system 332, and control system 336. Propulsion system 308, or a conveyance system, is arranged to cause autonomous vehicle 101 to move, e.g., drive. For example, when autonomous vehicle 101 is configured with a multi-wheeled automotive configuration as well as steering, braking systems and an engine, propulsion system 308 may be arranged to cause the engine, wheels, steering, and braking systems to cooperate to drive. In general, propulsion system 308 may be configured as a drive system with a propulsion engine, wheels, treads, wings, rotors, blowers, rockets, propellers, brakes, etc. The propulsion engine may be a gas engine, a turbine engine, an electric motor, and/or a hybrid gas and electric engine.

Navigation system 312 may control propulsion system 308 to navigate autonomous vehicle 101 through paths and/or within unstructured open or closed environments. Navigation system 312 may include at least one of digital maps, street view photographs, and a global positioning system (GPS) point. Maps, for example, may be utilized in cooperation with sensors included in sensor system 324 to allow navigation system 312 to cause autonomous vehicle 101 to navigate through an environment.

Sensor system 324 includes any sensors, as for example LiDAR, radar, ultrasonic sensors, microphones, altimeters, and/or cameras. Sensor system 324 generally includes onboard sensors which allow autonomous vehicle 101 to safely navigate, and to ascertain when there are objects near autonomous vehicle 101. In one embodiment, sensor system 324 may include propulsion systems sensors that monitor drive mechanism performance, drive train performance, and/or power system levels.

Power system 332 is arranged to provide power to autonomous vehicle 101. Power may be provided as electrical power, gas power, or any other suitable power, e.g., solar power or battery power. In one embodiment, power system 332 may include a main power source, and an auxiliary power source that may serve to power various components of autonomous vehicle 101 and/or to generally provide power to autonomous vehicle 101 when the main power source does not have the capacity to provide sufficient power.

Communications system 340 allows autonomous vehicle 101 to communicate, as for example, wirelessly, with a fleet management system (not shown) that allows autonomous vehicle 101 to be controlled remotely. Communications system 340 generally obtains or receives data, stores the data, and transmits or provides the data to a fleet management system and/or to autonomous vehicles 101 within a fleet 100. The data may include, but is not limited to including, information relating to scheduled requests or orders, information relating to on-demand requests or orders, and/or information relating to a need for autonomous vehicle 101 to reposition itself, e.g., in response to an anticipated demand.

Environmental control system 342 may include components which allow systems of autonomous vehicle 101 to be protected from environmental conditions including, but not limited to including condensation, moisture, humidity, excess heat, and/or excess cold. To substantially control the environment to which systems of autonomous vehicle 101 may be exposed, environmental control system 342 may include, but is not limited to including, sealed enclosures, heat exchangers, cold plates, coolants, and/or pipes which enable coolants to substantially pass through autonomous vehicle 101.

In some embodiments, control system 336 may cooperate with processor 304 to determine where autonomous vehicle 101 may safely travel, and to determine the presence of objects in a vicinity around autonomous vehicle 101 based on data, e.g., results, from sensor system 324. In other words, control system 336 may cooperate with processor 304 to effectively determine what autonomous vehicle 101 may do within its immediate surroundings. Control system 336 in cooperation with processor 304 may essentially control power system 332 and navigation system 312 as part of driving or conveying autonomous vehicle 101. Additionally, control system 336 may cooperate with processor 304 and communications system 340 to provide data to or obtain data from other autonomous vehicles 101, a management server, a global positioning server (GPS), a personal computer, a teleoperations system, a smartphone, or any computing device via the communication module 340. In general, control system 336 may cooperate at least with processor 304, propulsion system 308, navigation system 312, sensor system 324, and power system 332 to allow vehicle 101 to operate autonomously. That is, autonomous vehicle 101 is able to operate autonomously through the use of an autonomy system that effectively includes, at least in part, functionality provided by propulsion system 308, navigation system 312, sensor system 324, power system 332, and control system 336. Such an autonomy system may be implemented, at least in part, as part of an overall electronic system, e.g., a compute system.

As will be appreciated by those skilled in the art, when autonomous vehicle 101 operates autonomously, vehicle 101 may generally operate, e.g., drive, under the control of an autonomy system. That is, when autonomous vehicle 101 is in an autonomous mode, autonomous vehicle 101 is able to generally operate without a driver or a remote operator controlling autonomous vehicle. In one embodiment, autonomous vehicle 101 may operate in a semi-autonomous mode or a fully autonomous mode. When autonomous vehicle 101 operates in a semi-autonomous mode, autonomous vehicle 101 may operate autonomously at times and may operate under the control of a driver or a remote operator at other times. When autonomous vehicle 101 operates in a fully autonomous mode, autonomous vehicle 101 typically operates substantially only under the control of an autonomy system.

Components, e.g., electronic or electrical components, within autonomous vehicle 101 may be contained within a substantially sealed enclosure, e.g., a sealed electronic enclosure. Positioning some components in a sealed enclosure prevents those components to be protected from external elements included, but not limited to including, debris and moisture. A heat exchanger may be provided in an enclosure to provide cooling capabilities. Components within the enclosure may be cooled by air, and may include components that typically operate at an ambient temperature such as a room temperature, and components with natural convection heatsinks.

Figure 4:
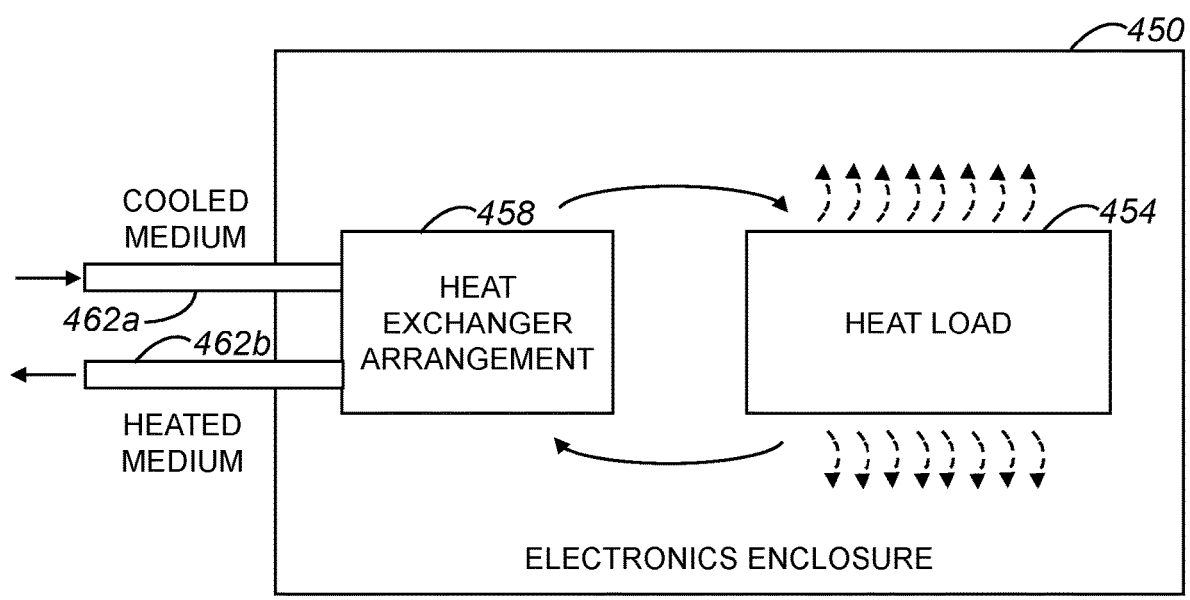
FIG. 4 is a block diagram representation of an electronic enclosure that is provided with a heat exchanger arrangement or mechanism to provide cooling within the electronic enclosure in accordance with an embodiment.

With reference to FIG. 4, an electronic enclosure that is includes a heat exchanger mechanism configured to provide cooling within the electronic enclosure will be described in accordance with an embodiment. An electronic enclosure 450 may be arranged to contain a heat load 454, and may effectively prevent heat load 454 from being exposed to the environment. That is, heat load 454 may be sealed within enclosure 450. Enclosure 450 may provide an air-tight seal. Heat load 454 may generally be any component which generates or emanates heat, including but not limited to including, printed circuit boards, power supplies, and the like.

An internal air volume within enclosure 450 may be used as a medium to substantially control the temperature within enclosures 450. Thus, the use of either a heatsink to absorb heat or a cold plate to provide cooling within enclosure 450 may be substantially avoided.

A heat exchanger arrangement 458 may be provided within enclosure 450, and may be arranged to accept a cooled medium, e.g., a liquid, through an inlet tube 462a and to expel a heated medium through an outlet tube 462b. Heat exchanger arrangement 458 may be arranged to effectively disperse cooling provided by the medium within enclosure 450, and to absorb heat from heat load 454 into the medium. In other words, heat exchanger arrangement 458 may be arranged to provide cooling and to absorb heat within enclosure 454. Heat exchanger arrangement 458 may be included as part of an overall environmental control system such as environmental control system 342 of FIG. 3.

Heat exchanger arrangement 458 may be any suitable arrangement which is arranged to provide cooling and to absorb heat. In one embodiment, heat exchanger arrangement 458 may provide cooling when inlet 462a provides a cooled medium, and alternatively be configured to provide heat, and may alternatively provide heating when inlet 462a provides a heated medium. In one embodiment, heat exchanger arrangement 458 may include a radiator.

Figure 5A:
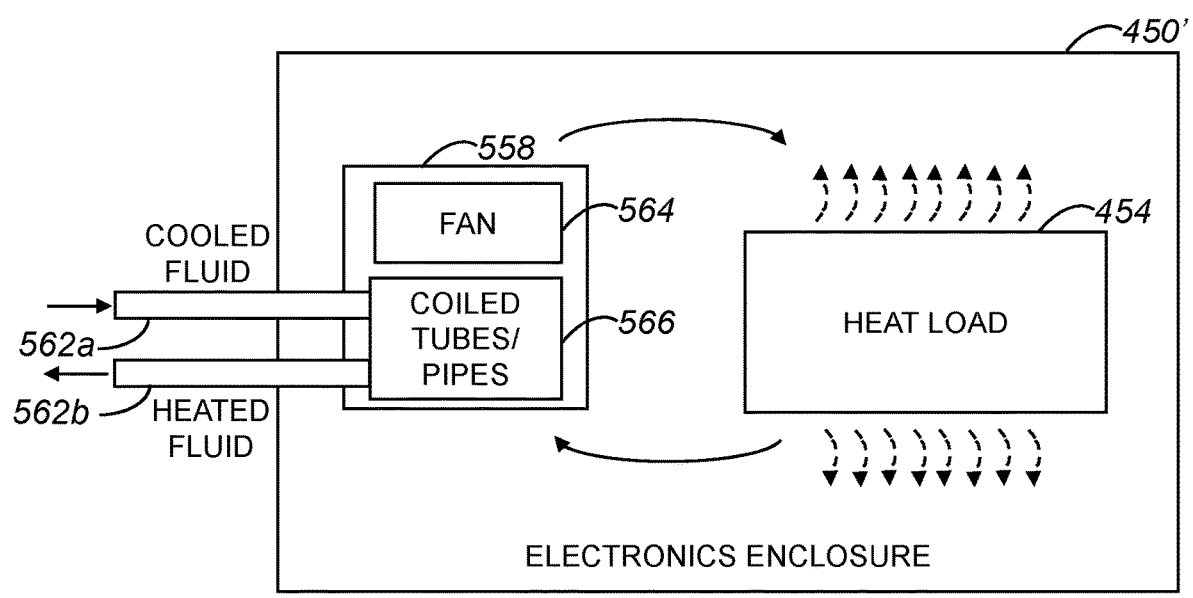
FIG. 5A is a block diagram representation of an electronic enclosure, e.g., electronic enclosure 450 of FIG. 4, that is provided with a heat exchanger mechanism that includes a fan and a coiled tube arrangement in accordance with an embodiment.

FIG. 5A is a block diagram representation of an electronic enclosure such as electronic enclosure 450 of FIG. 4 that is provided with a heat exchanger arrangement which includes a fan and a coiled tube or pipe arrangement in accordance with an embodiment. An electronic enclosure 450' includes heat load 454 and a heat exchanger arrangement 558 that is arranged to provide temperature control within enclosure 450'. In one embodiment, heat exchanger arrangement 558 provides cooling by taking in cooled fluid through an inlet port 562a and expelling heated fluid through an outlet port 562b.

Heat exchanger arrangement 558 may generally include an arrangement of tubes or pipes 566 that is arranged to alter temperature within enclosure 450'. In one embodiment, heat exchanger arrangement 558 includes coiled tubes 566 through which fluid may flow. Heat exchanger arrangement 558 also includes a fan 564. As cooled fluid 562a flows into coiled tubes 566, fan 564 blows air that is cooled by the coiled tubes 566 such that heat emanating from heat load 454 may be dispersed, and air within enclosure 450' may be cooled.

Heat emanating from heat load 454, in addition to being dispersed when cooled air is circulated by fan 564, may be absorbed by fluid flowing through heat exchanger arrangement 558, and may effectively be removed from enclosure 450' through outlet 562b. Heated fluid 562b, once removed from enclosure 450' via an outlet, may be cooled and provided to heat exchanger arrangement 558 as cooled fluid 562a through inlet 562a.

It should be appreciated that heat exchanger arrangement 558 may be situated substantially anywhere within enclosure 450'. In one embodiment, heat exchanger arrangement 558 may be partially positioned next to, around, above, and/or below heat load 454. That is, portions of heat exchanger arrangement 558, such as tubes which run between coiled tubes 566 and outlet 562b, may be arranged in relatively close proximity to heat load 454.

Figure 5B:
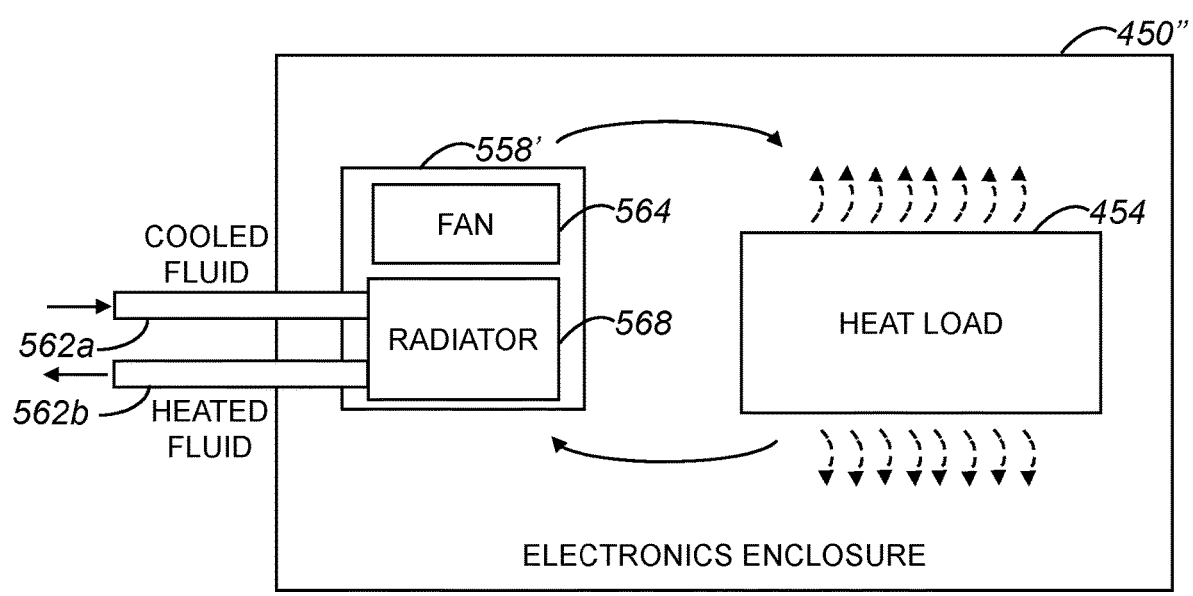
FIG. 5B is a block diagram representation of an electronic enclosure such as electronic enclosure 450 of FIG. 4 that is provided with a heat exchanger arrangement which includes a fan and a radiator arrangement in accordance with an embodiment.

In general, in lieu of an arrangement of tubes or pipes 566 that alter temperature, a radiator may be used. Such a radiator may include, but is not limited to including, tubes or pipes. FIG. 5B is a block diagram representation of an electronic enclosure such as electronic enclosure 450 of FIG. 4 that is provided with a heat exchanger arrangement which includes a fan and a radiator arrangement in accordance with an embodiment. An electronic enclosure 450" includes heat load 454 and a heat exchanger arrangement 558' that is arranged to provide temperature control within enclosure 450".

Heat exchanger arrangement 558' may generally include a radiator 568 that is arranged to alter temperature within enclosure 450'. Heat exchanger arrangement 558' also includes a fan 564. As cooled fluid 562a flows into radiator 568, fan 564 may provide air flow that blows air such that heat emanating from heat load 454 may be dispersed, and air within enclosure 450" may be cooled. Heated fluid 562b, once removed from enclosure 450", may be cooled and provided to heat exchanger arrangement 558' through an inlet that accepts cooled fluid 562a.

Figure 6:
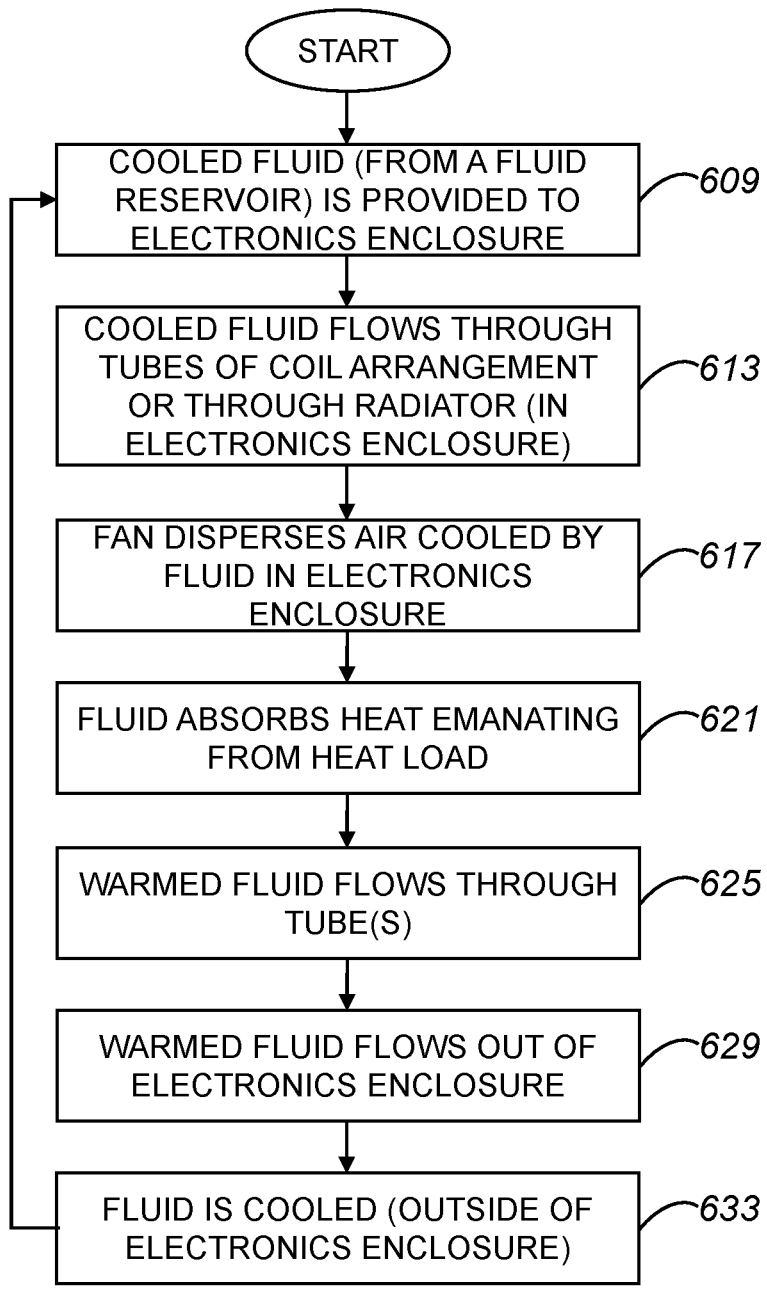
FIG. 6 is a process flow diagram which illustrates a method of providing cooling within an electronic enclosure in accordance with an embodiment.

With reference to FIG. 6, a method of providing cooling within an electronic enclosure will be described in accordance with an embodiment. A method 605 of providing cooling within an enclosure begins at a step 609 in which a cooled fluid, e.g., a fluid from a reservoir that is external to enclosure, is provided to the enclosure through an inlet such as an ingress tube. The fluid may be any suitable fluid including, but not limited to including, air, water, refrigerant, freon, and liquid nitrogen. The cooled fluid may be provided to the enclosure through tubing, pipes, and/or the like.

In a step 613, the cooled fluid flows through tubes of a coil arrangement that is part of a heat exchanger, e.g., coiled tubes of a heat exchanger as discussed above with respect to FIG. 5A, or through a radiator, e.g., a radiator of a heat exchanger as discussed above with respect to FIG. 5B. As the cooled fluid flows through tubes of the coil arrangement, a fan disperses air cooled by the fluid in the enclosure in a step 617. The fan may be a rotary fan, or any air mover which is capable of blowing the cooled air over a heat load. The coil arrangement may generally be arranged next to, above, and/or below the fan.

As the cooled air passes around, over, and/or under a heat load, the fluid may absorb heat emanating from the heat load in a step 621. In other words, the heat load is effectively cooled using air. At least one tube of the heat exchanger, in one embodiment, may pass around, over, and/or under the heat load such that heat emitted from the heat load may be absorbed by the fluid flowing through the tube. In general, fluid flows through the coiled tubes and into the tube, e.g., the egress tube, that passes around, over, and/or under the heat load. As the fluid absorbs heat, the temperature of the fluid rises, i.e., the fluid is warmed. As will be appreciated by those skilled in the art, the temperature of the fluid after heat is absorbed is generally higher than the temperature of the fluid as it passes in the vicinity of the fan.

The warmed fluid passes through the egress tube in a step 625. The warmed fluid then flows out of the enclosure, as for example through an outlet, in a step 629. The fluid is then cooled in a step 633. Cooling the fluid may occur in a reservoir that is outside of the enclosure. Once the fluid is cooled, process flow returns to step 609 in which the cooled fluid is provided back into the enclosure.

Figure 7A:
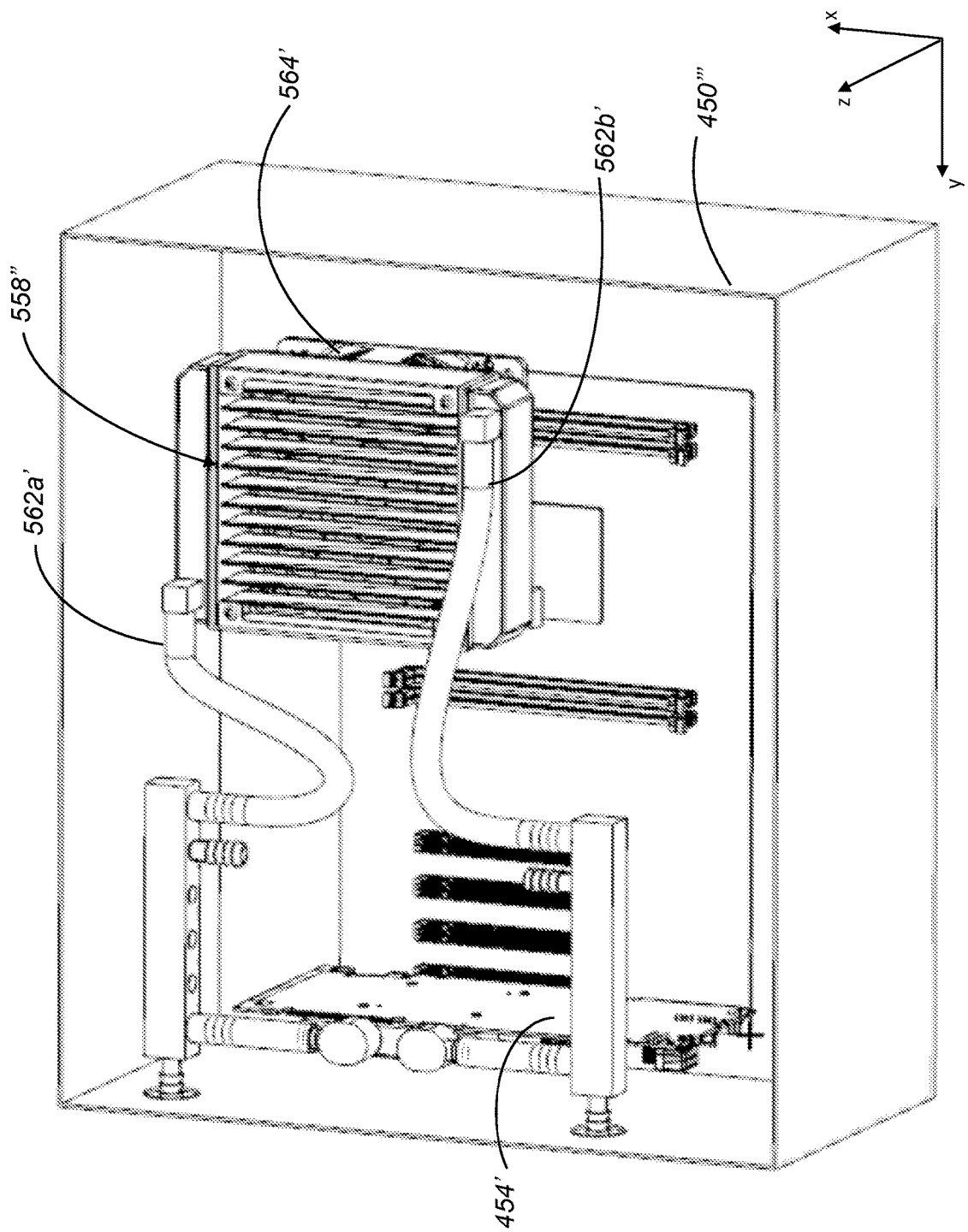
FIG. 7A is a diagrammatic cutaway representation of an electronic enclosure with a heat sink that is cooled by a heat exchanger mechanism in accordance with an embodiment.

Referring next to FIG. 7A, one example of an electronic enclosure with a heat exchanger arrangement will be described. FIG. 7A is a diagrammatic cutaway representation of an electronic enclosure with a heat sink that is cooled by a heat exchanger mechanism in accordance with an embodiment. An electronic enclosure 450''', which is shown in cutaway with a top portion not shown for ease of illustration, is arranged such that a heat load 454' and a heat exchanger mechanism 558" may be substantially contained within enclosure 450'. Heat load 454' may generally be any component or components which generate or otherwise emanate heat, e.g., heat load 454' may be an assembly of one or more printed circuit boards.

Heat exchanger mechanism 558" includes a fan 564' and tubes (not shown), which may be coiled tubes or pipes. A cooled fluid is arranged to be provided to heat exchanger mechanism 558" through an inlet 562a', while a heated fluid is arranged to be removed from heat exchanger mechanism 558" through an outlet 562b'. As cooled fluid passes through tubes (not shown) of heat exchanger mechanism 558", fan 564' may blow air that is cooled by the effects of cooled fluid passing through tubes. The cooled air may then cause the environment within enclosure 450''' to be cooled. Heat emanating from heat load 454' that is not substantially dissipated by the blown, cooled air may be absorbed by fluid as it passes out of tubes 566' to outlet 562b'.

Figure 7B:
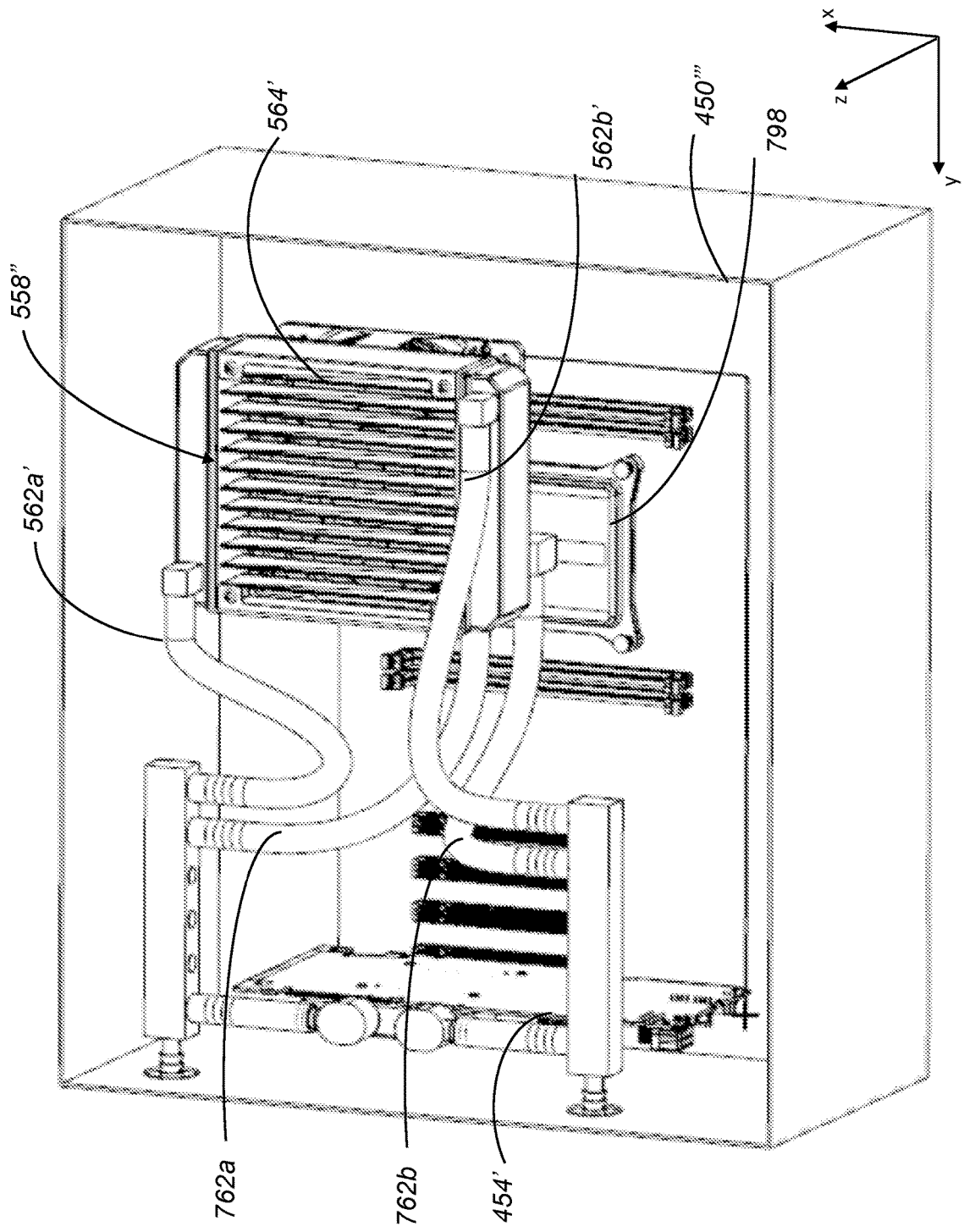
FIG. 7B is a diagrammatic cutaway representation of an electronic enclosure with a heat sink that is cooled by a heat exchanger mechanism, e.g., electronic enclosure 450''' of FIG. 7A, as shown with a central processing unit (CPU) cold plate in accordance with an embodiment.

Enclosure 450''' generally contains other components which have not been shown for ease of illustration. For example, enclosure 450''' may contain a central processing unit (CPU) which is arranged to be cooled by a CPU cold plate. As shown in FIG. 7B, within enclosure 450''', cooled fluid may additionally be provided to a secondary inlet 762a that is coupled to a CPU cold plate 798 such that CPU cold plate 798 may provide cooling, e.g., to a CPU (not shown). Warmed fluid, or fluid that is warmed by heat collected by CPU cold plate 798, may be provided to a secondary outlet 762b.

As previously mentioned, once a coolant has absorbed heat from a system that is to be cooled, the coolant may be at a temperature that is higher than a desired temperature for the coolant. Thus, the coolant may be cooled, e.g., in a reservoir using a chiller, before the coolant is substantially recirculated or otherwise reused to provide cooling to the system. However, in some instances, rather than cooling the coolant before the coolant is to be recirculated to cool the system, the temperature of the coolant may be raised or increased to substantially reduce the likelihood that condensation may affect the system.

When condensation forms within an electronic system, the condensation may have an adverse impact on the operation of the electronic system. Condensation may form when a cooling system, such as a cooling system which utilizes a liquid coolant that flows through a cold plate, is at a temperature below a dew point temperature. Condensation forms when water vapor in air condenses to from liquid water as the air is cooled to a dew point temperature when the air contacts a cold plate of a cooling system.

A dew point temperature is generally a temperature at which dew may form, and below which vapor may begin to condense, e.g., the temperature below which water vapor in the air generally condenses to form droplets of water. By definition, a dew point is a temperature that air is to be cooled to, at a substantially constant pressure, for a relative humidity of approximately one hundred percent to be achieved.

To reduce the likelihood that condensation forms, the temperature of a cooling system or, more specifically, the temperature of a coolant and/or a cold plate included in the cooling system, may be maintained at a temperature that is above a dew point temperature of air. That is, the temperature of cold plates included in a cooling system that cools an electronic system may be finely controlled such that the temperature may be maintained to be above a dew point.

The temperature of coolant and/or a cold plate may be controlled using any suitable method. Suitable methods include, but are not limited to including, the utilization of an in-line heater to raise a temperature of a coolant, the utilization of a pump to inject exhaust coolant into an inlet stream to raise a temperature of a coolant, and the utilization of a heat exchanger with a main loop and a cooling loop.

Figure 8:
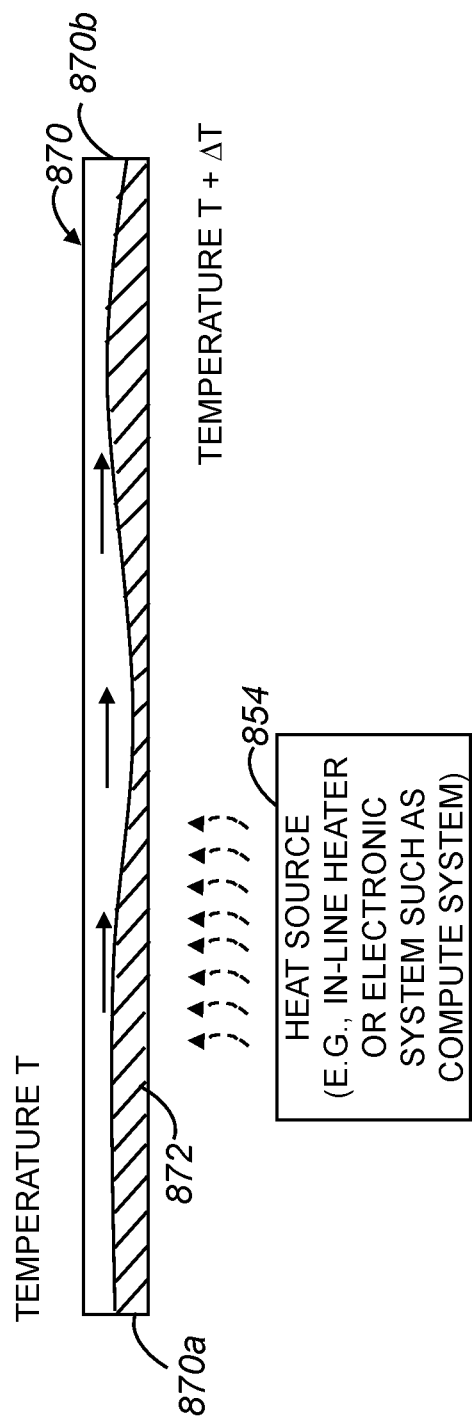
FIG. 8 is a block diagram representation of a system in which a heat source increases a coolant temperature to a temperature above a dew point to substantially prevent condensation in accordance with an embodiment.

FIG. 8 is a block diagram representation of a system in which a heat source increases a coolant temperature to a temperature above a dew point to substantially prevent condensation in accordance with an embodiment. A heat source 854, which may be a heater arranged specifically to generate heat or an electronic system which serves another purpose but generates heat as a by-product, emanates heat that may heat a coolant 872. Coolant 872 may flow through a tube or a pipe 870, e.g., from a coolant reservoir (not shown) in communication with a first end 870a of tube 870 to a cooling plate (not shown) in communication with a second end 870b of tube 870.

As coolant 872 flows through tube 820, coolant 872 is heated by heat emanating from heat source 854. At first end 870a, coolant 872 may have a temperature T that is below a dew point, e.g., a dew point of the air in the environment around tube 870. That is, at first end 870a, coolant 872 may be in a first state. Heat source 854 heats coolant 872 such that at second end 870b, coolant may have a temperature T+$\Delta$T that is above the dew point. That is, at second end 870b, coolant may be in a warmed state. In one embodiment, heat source 854 substantially imparts a temperature increase of $\Delta$T to coolant 872 as coolant flows through tube 820.

A temperature T may be in a range of between approximately ten degrees Celsius (C) and approximately thirty-two degrees C., e.g., between approximately thirty degrees C. and approximately thirty-one degrees C. A temperature increase of $\Delta$T may be in a range of between approximately one degree C. and approximately eight degrees C. That is, a set point temperature may be in a range of between approximately eleven degrees C. and approximately forty degrees C. It should be appreciated that the temperature and temperature increase may vary widely depending upon factors including, but not limited to including, the pressure of air in the environment in which cooling is to occur, the amount of heat that components may tolerate, the humidity in air in the environment in which cooling is to occur, and/or the type of coolant used. In one embodiment, a temperature T may be associated with a dew point of between approximately twenty degrees C. and approximately thirty-two degrees C., when humidity is greater than approximately thirty percent.

When heat source 854 is an in-line heater that is specifically arranged to heat coolant 872, the mount of heat provided by heat source 854 may be controlled. In other words, the amount of heat provided by heat source 854 may be adjusted based on temperature T to substantially ensure that when coolant is a second end 870b, coolant is at a temperature above a dew point temperature. Heat may also be provided by a thermal load, and the heat from a thermal load maybe controlled by the set points of a cooling mechanism.

Figure 9:
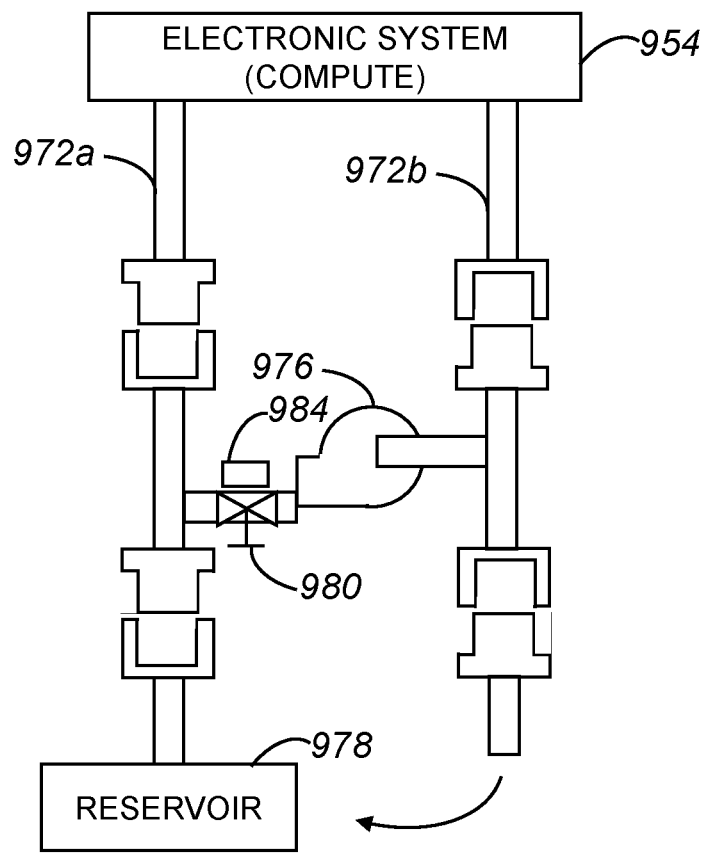
FIG. 9 is a diagrammatic representation of a system in which a temperature of a coolant may be increased through utilizing a recirculation pump in accordance with an embodiment.

FIG. 9 is a diagrammatic representation of a system in which a temperature of a coolant may be increased through utilizing a recirculation pump in accordance with an embodiment. An electronics system 954, which may be a compute system of an autonomous vehicle, may be cooled by a cooling system which includes a recirculation pump 976. Cooled coolant 972a is provided to cool electronic system 954, and warmed coolant 972b flows away from electronic system 954 after absorbing heat emanating from electronic system 954. In one embodiment, cooled coolant 972a is provided to a cold plate (not shown) arranged to cool electronic system 954, and warmed coolant 972b is removed from the cold plate after heat emanating from electronic system 954 is absorbed. Cooled coolant 972a may be considered to be coolant in a first state, and warmed coolant 972b may be considered to be coolant in a second state, or a state in which warmed coolant 972b has absorbed heat generated by system 954.

Cooled coolant 972a may be provided from a reservoir 978 at a temperature T, e.g., a temperature below a dew point. When cooled coolant 972a is at a temperature below a dew point, recirculation pump 976 may effectively cause some amount of warmed coolant 972b to mix with cooled coolant 972a to raise temperature T to a temperature above the dew point temperature, e.g., temperature T+ΔT. In one embodiment, temperature sensors 984 may be implemented in conjunction with a valve 980 may be used to determine how much warmed coolant 972a is to be mixed into cooled coolant 972a to achieve a desired temperature above a dew point temperature.

Figure 10A:
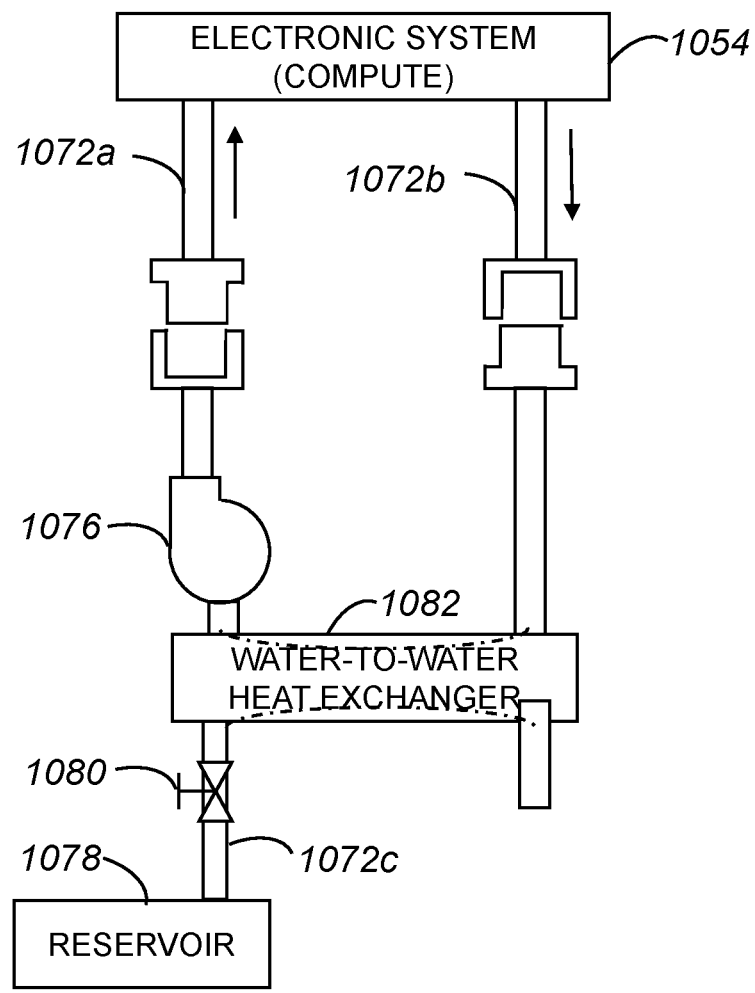
FIG. 10A is a diagrammatic representation of a system in which a temperature of a coolant may be increased through a liquid-to-liquid heat exchanger in accordance with an embodiment.

FIG. 10 is a diagrammatic representation of a system in which a temperature of a coolant may be increased through a liquid-to-liquid heat exchanger in accordance with an embodiment. An electronic system 1054 such as a compute system may be cooled by a cooling system which includes, but is not limited to including, a heat exchanger 1082, as for example a water-to-water heat exchanger. A water-to-water heat exchanger may use heat from water, or coolant, which carries heat removed from electronic system 1054, e.g., wastewater, to effectively heat water, or coolant, which is to be used for cooling purposes, e.g., fresh water.

Cooled coolant 1072a is provided to cool electronic system 1054, and warmed coolant 1072b flows away from electronic system 1054 after absorbing heat emanating from electronic system 1054. In one embodiment, cooled coolant 1072a is provided to a cold plate (not shown) arranged to cool electronic system 1054, and warmed coolant 1072b is removed from the cold plate after heat emanating from electronic system 1054 is absorbed.

Heat exchanger 1082 is arranged to effectively mix warmed or heated coolant 1072b into coolant 1072c provided from a reservoir 1078, or bot supply, to allow cooled coolant 1072a to have a temperature that is above a dew point temperature. In one embodiment, an amount of coolant 1072c provided from reservoir 1078 is controlled such that a suitable amount of coolant 1072c may be injected into heated coolant 1072b to allow for cooled coolant 1072a to be at a desired temperature, i.e., a temperature above a dew point temperature. The control of the amount of heated coolant 1072b to inject into coolant 1072c may at least be partially controlled by a valve arrangement 1080 which may include a valve as well as a temperature sensor. In cooperation with a pump 1076, coolant 1072c which has been injected with heated coolant 1072b may effectively form coolant 1072a that is provided to electronic system 1054.

Figure 10B:
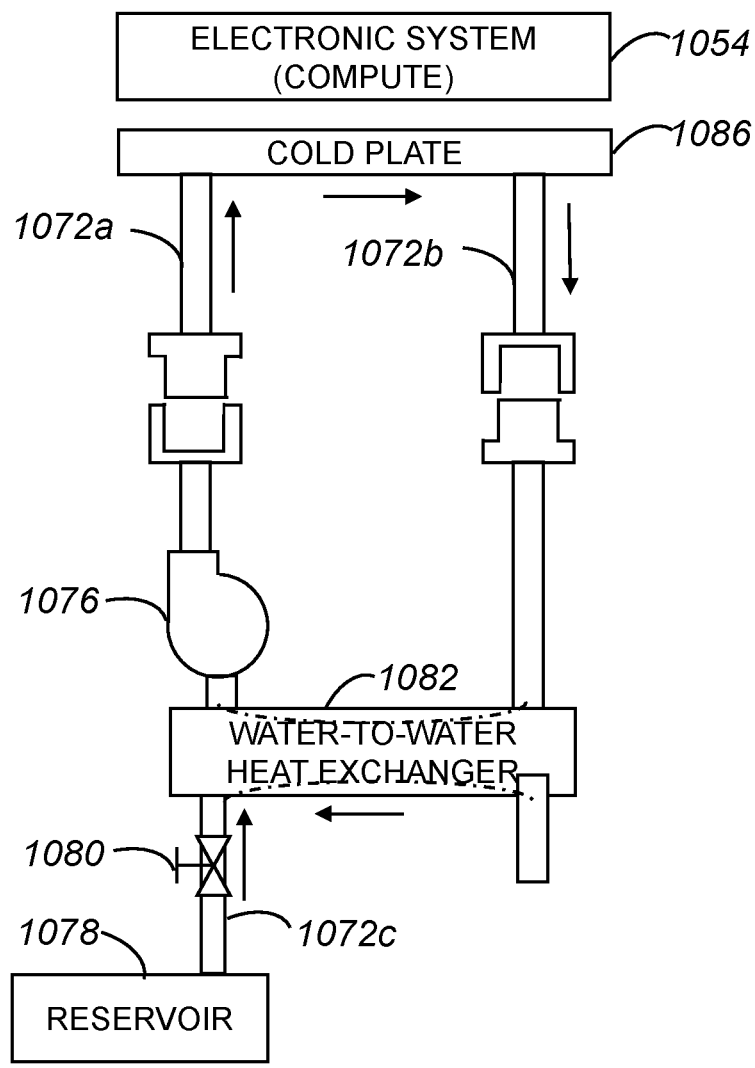
FIG. 10B is a diagrammatic representation of a system in which a temperature of a coolant may be increased through a liquid-to-liquid heat exchanger, e.g., liquid-to-liquid heat exchanger 1082 of FIG. 10A, in conjunction with a cold plate in accordance with an embodiment.

As mentioned above, coolant 1072a may be provided to a cold plate which is arranged to cool electronic system 1054. As shown in FIG. 10B, a cold plate 1086 may be positioned near electronic system 1054, and coolant 1072a may be heated or warmed by electronic system 1054 as coolant 1072a passes through cold plate 1086, and heated coolant 1072b may effectively exit cold plate 1086.

Figure 11:
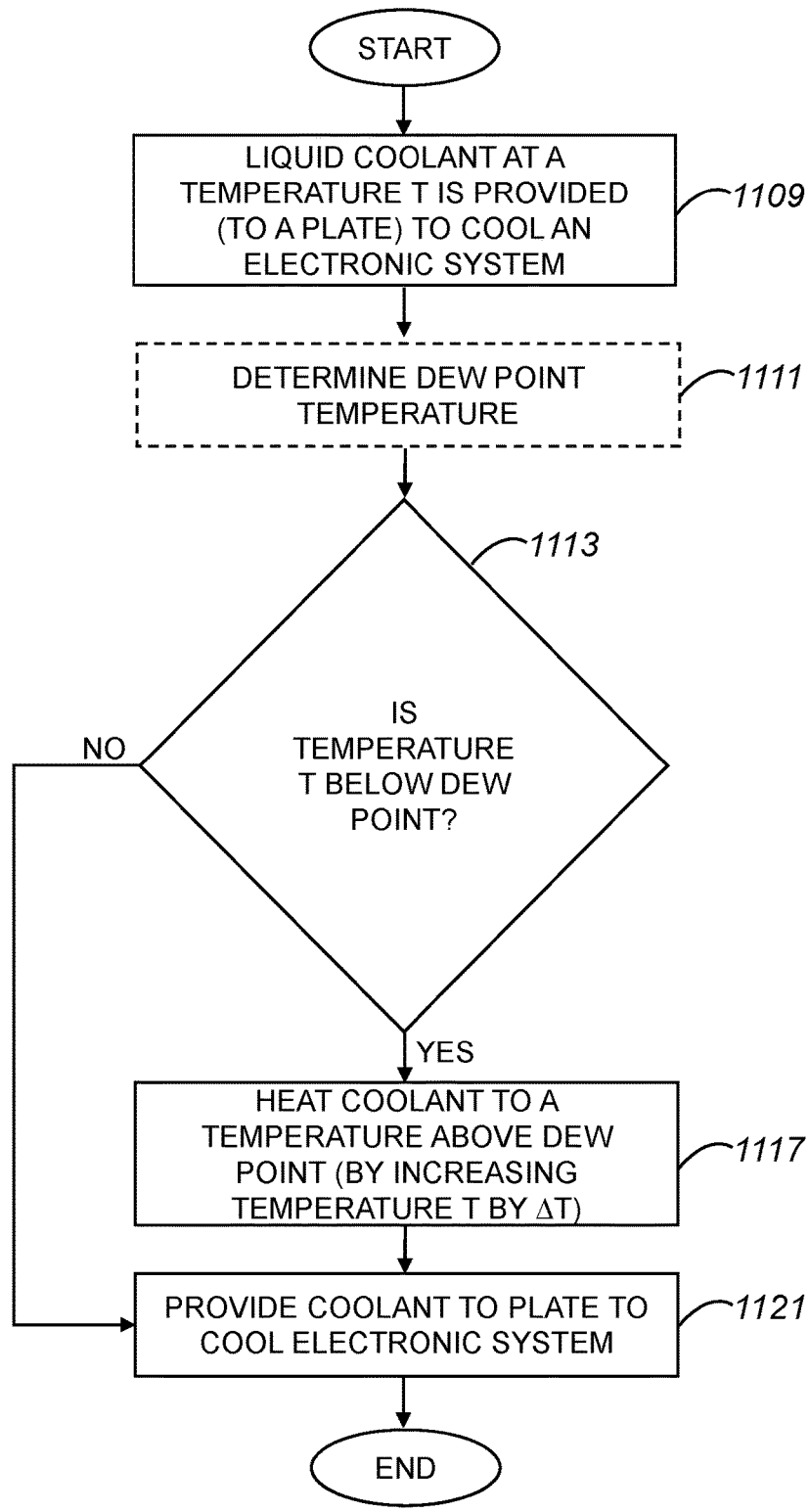
FIG. 11 is a process flow diagram which illustrates a method of maintaining a liquid coolant at a temperature above a dew point in accordance with an embodiment.

Referring next to FIG. 11, a method of maintaining a liquid coolant at a temperature above a dew point temperature will be described in accordance with an embodiment. A method 1105 of maintaining a coolant at a temperature above a dew point temperature begins at a step 1109 in which a liquid coolant, which has a temperature T, is provided to cool an electronic system such as a compute system of an autonomous vehicle. In one embodiment, the liquid coolant is provided to a plate such as a cold plate that is arranged in the vicinity of the electronic system to allow the cold plate to effectively cool the electronic system.

Once a liquid coolant is provided, a dew point temperature may be determined in an optional step 1111. If a dew point is to effectively be identified, measurements associated with the air in an environment around the autonomous vehicle may be made, e.g., using a hygrometer or similar device, to assess the dew point. It should be appreciated that when a dew point temperature is substantially known, optional step 1111 may be skipped.

In a step 1113, a determination is made as to whether the temperature T of the coolant is below a dew point temperature. That is, it is determined whether the coolant is to be heated in order for the coolant to be at a temperature above the dew point temperature.

If the determination is that the temperature T is not below the dew point, the implication is that the coolant will not cause or otherwise promote condensation. Accordingly, process flow moves from step 1113 to a step 1121 in which the coolant is provided, as for example to a plate, to cool the electronic system. Once the coolant is provided to the plate to cool the electronic system, the method of maintaining a coolant above a dew point temperature is completed.

Returning to step 1113, if it is determined that the temperature T of the coolant is below the dew point temperature, the indication is that the temperature of the coolant is to be raised to prevent condensation from forming. That is, the implication is that a set point of the coolant is to be increased due to changes in the dew point temperature based on, for example, environmental conditions. As such, in a step 1117, the coolant is heated to a temperature above a dew point temperature. Heat is provided to increase the temperature T by ΔT to a temperature T+ΔT, which is above the dew point temperature. Temperature T+ΔT may be a new set point temperature for the coolant. The heat may be provided by any suitable method including, but not limited to including, providing heat using an in-line heater, providing heat using a recirculation pump, providing heat using a heat exchanger, and/or providing heat by combining coolant warmed when heat is transferred from the electronic system with coolant that is to be provided to cool the electronic system. After the coolant is heated to a temperature above the dew point, the coolant is provided to a plate to cool the electronic system in step 1121, and the method of maintaining a coolant above a dew point temperature is completed.

Figure 12:
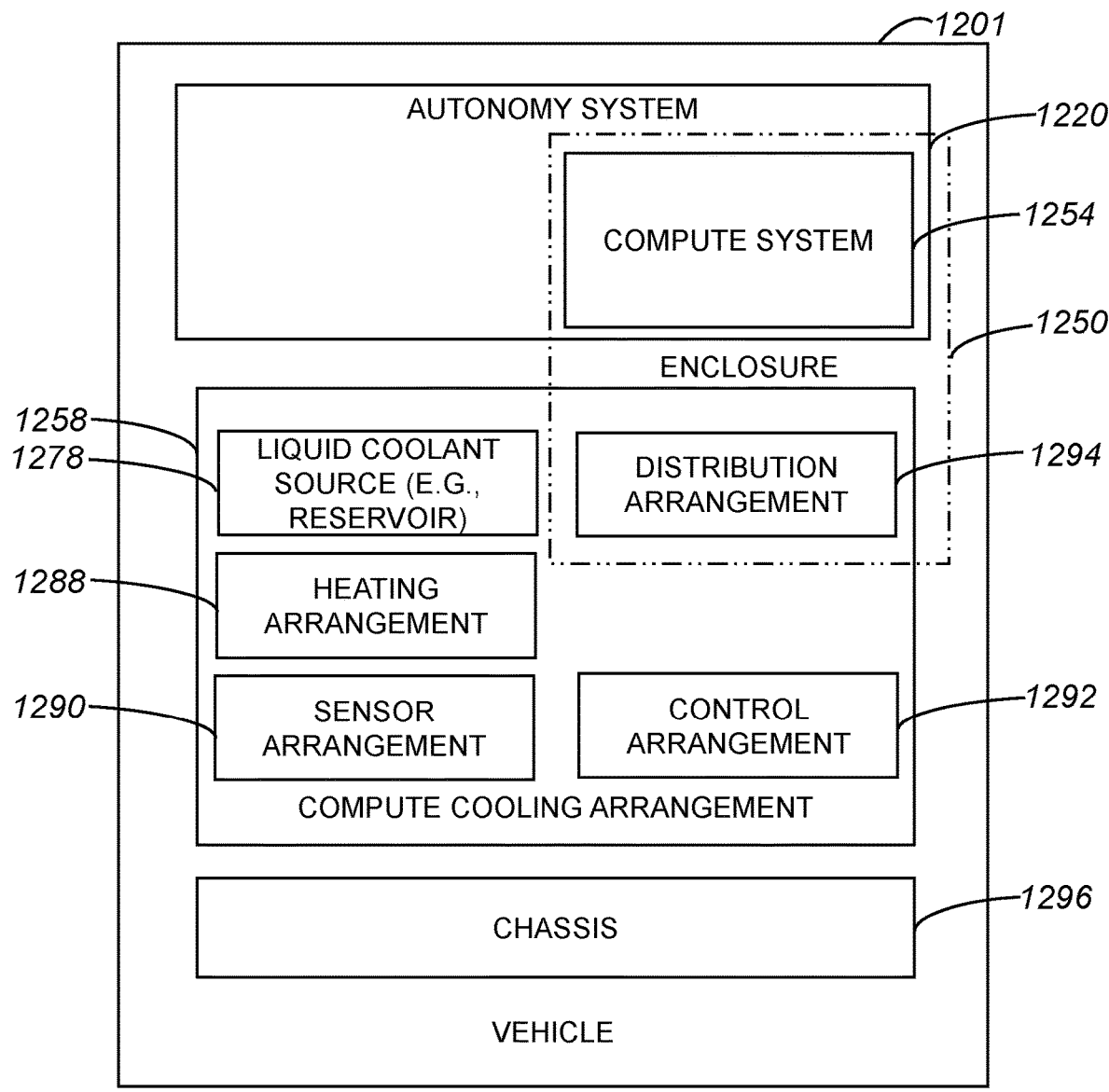
FIG. 12 is a block diagram representation of a vehicle that includes a cooling arrangement in accordance with an embodiment.

A vehicle, e.g., an autonomous vehicle, may generally include a cooling arrangement which is configured to utilize coolant that is warmed or heated to a temperature above a dew point. FIG. 12 is a block diagram representation of a vehicle that includes a cooling arrangement in accordance with an embodiment. A vehicle 1201, which may include systems as described above with respect to FIG. 3, includes an autonomy system 1220 which includes a compute system 1254 or, more generally, an electronics system. Vehicle 1201 also includes a compute cooling arrangement 1258 that is arranged to provide cooling with respect to compute system 1254.

Compute system 1254 may generally include hardware and/or software which supports the operation of autonomy system 1220 which allows vehicle 1201 to operate in an autonomous matter. Typically, hardware included in compute system 1254 may include electronic components which generate heat.

Compute cooling arrangement 1258 is configured to provide cooling that may cool compute system 1254 and/or an environment around compute system 1254. Compute cooling arrangement 1258 includes a liquid coolant source 1278 which may include a reservoir in which a liquid coolant is stored. In one embodiment, liquid coolant source may include a chiller or cooling system that cools liquid coolant contained in a reservoir. Compute cooling arrangement 1258 also includes a heating arrangement 1288, a sensor arrangement 1290, a control arrangement 1292, and a distribution arrangement 1294.

Heating arrangement 1288 may include, but is not limited to including, a heater or other electronic and/or mechanical device which may transfer heat into a liquid coolant. Heating arrangement 1288 may also include heated or warmed liquid coolant, e.g., liquid coolant into which heat generated by or emanating from compute system 1254 is transferred.

Sensor arrangement 1290 may generally include sensors configured to provide information relating to vehicle 1201 which may have an effect on cooling. For example, sensor arrangement 1290 may include temperature sensors arranged to measure a temperature of compute system 1254, a temperature of liquid coolant within liquid coolant source 1278, a temperature of liquid coolant circulating through compute cooling arrangement 1258, a temperature of liquid coolant into which heat associated with compute system 1254 has been transferred, and/or a temperature of an environment around compute system 1254. In one embodiment, sensor arrangement 1290 may provide temperature measurements using one or more thermocouples. Sensor arrangement 1290 may also include, but is not limited to including, sensors which measure a flow rate associated with liquid coolant, a rate at which cooling is provided by compute cooling arrangement 1258, an amount of heated or warmed liquid coolant mixed into cooler liquid coolant in order to raise a temperature of liquid coolant used to cool compute system 1254, etc. In one embodiment, sensor arrangement 1290 may include a hygrometer that may be used to measure a dew point temperature, or a temperature at which dew forms.

Control arrangement 1292 is configured to control an amount of liquid coolant provided to cool compute system 1254, and to control how much heated or warmed liquid coolant to mix into cooled liquid coolant as the cooled liquid coolant flows out of liquid coolant source 1278. Control arrangement 1292 may cooperate with sensor arrangement 1290 to control an amount of heated or warmed liquid coolant mixed with a cooled liquid coolant. In one embodiment, control arrangement 1292 may determine the amount of heated or warmed liquid coolant to substantially inject into the cooled liquid coolant to achieve at least a desired set point temperature. Such control may be provided, in one embodiment, by a valve arrangement and/or a water-to-water heat exchanger of control arrangement 1292.

Distribution arrangement 1294 may include, but is not limited to including, tubes, pipes, manifolds, and/or other mechanisms which facilitate the flow of liquid coolant to provide cooling. Distribution arrangement 1294 may include one or more pumps configured to facilitate the flow of liquid coolant. In one embodiment, distribution arrangement 1294 includes an inlet portion into which liquid coolant in a first state is provided to cool compute system 1254, as well as an outlet portion out of which liquid coolant in a second state passes after heat emanating from compute system 1254 is substantially absorbed by the liquid coolant. For example, distribution arrangement 1294 may include a cold plate with an inlet into which liquid coolant at a first temperature flows, and an outlet out of which liquid coolant at a second or higher temperature flows.

A liquid coolant may be provided to cool compute system 1254 when in a first state, and the liquid coolant may be in a second state after absorbing heat emanating from compute system 1254. When control arrangement 1292 effectively warms coolant to be provided to cool compute system 1254, the warmed coolant may essentially be in a third state. For example, after a first amount of liquid coolant in a first state is combined with a second amount of liquid coolant in a second state, a third amount of liquid coolant in a third state is effectively created. The first state may be a temperature of the liquid coolant in reservoir 1278, the second state may be a temperature of the liquid coolant after heat from compute system 1254 is absorbed, and the third state may be a set point temperature that is above a dew point. In general, the first state is associated with a lower temperature than the temperature associated with the third state, and the temperature associated with the third state is lower than the temperature associated with the second state.

In one embodiment, compute system 1254 and portions of compute cooling arrangement 1248 may be included in an enclosure 1250. For example, at least part of distribution arrangement 1294 may be included in enclosure 1250.

Vehicle 1201 also generally includes a chassis or a frame 1296 on which systems of vehicle including, but not limited to including autonomy system 1220 and compute cooling arrangement 1258 are supported. For example, chassis 1296 may support vehicle systems such as those described above with respect to FIG. 3.

Figure 13:
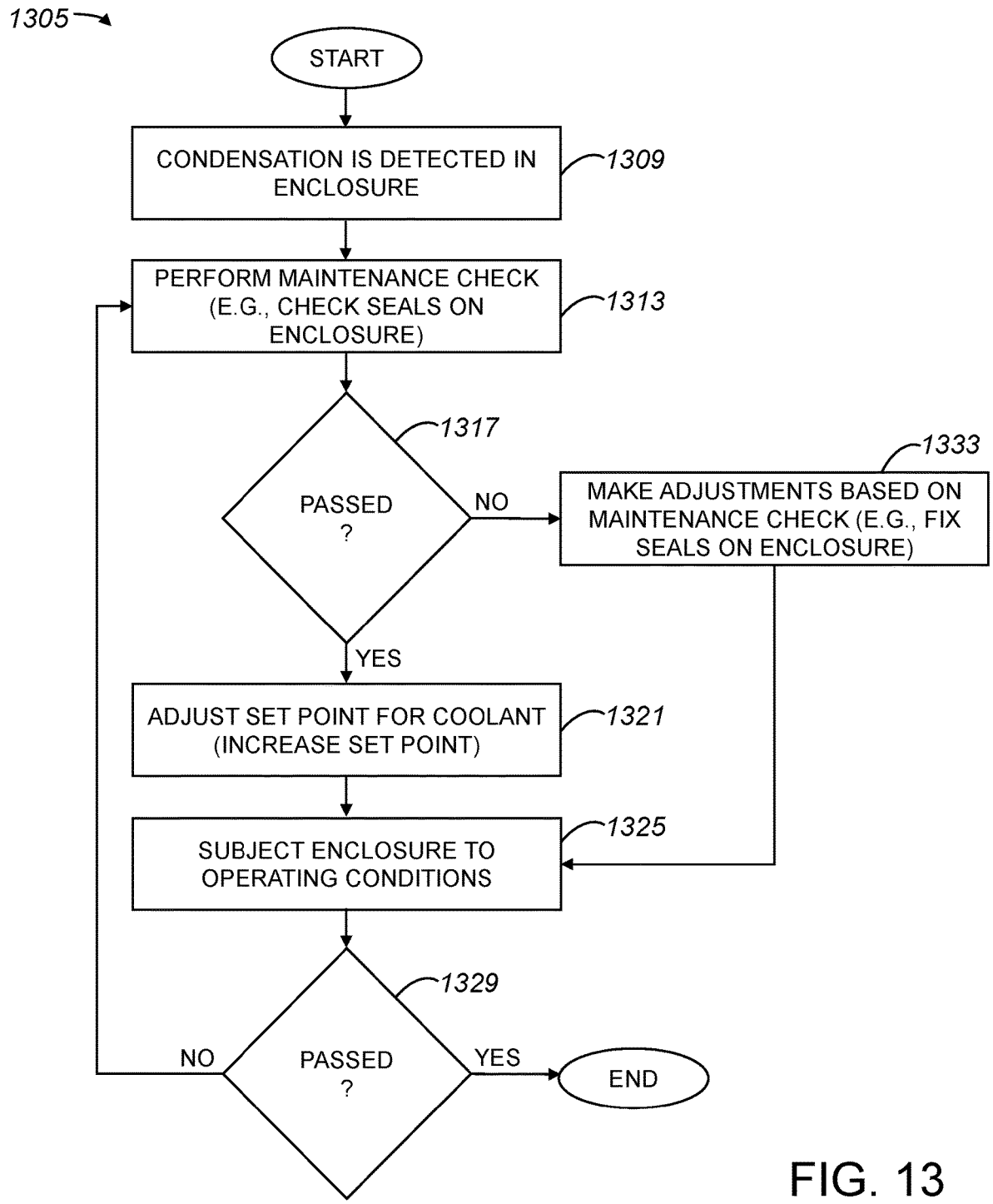
FIG. 13 is a process flow diagram which illustrates one method of addressing condensation issues within an enclosure in accordance with an embodiment.

When condensation is detected in an enclosure, measures may be taken in order to substantially mitigate the condensation issues. For example, when the performance of an autonomous vehicle is not as expected, and the cause of the performance issues is determined to be related to condensation found in an enclosure, steps may be taken to prevent condensation from occurring in the future. FIG. 13 is a process flow diagram which illustrates one method of addressing condensation issues within an enclosure in accordance with an embodiment. A method 1305 of addressing condensation issues begins at a step 1309 in which condensation is detected in an enclosure. Condensation may be detected through visual inspection, or may effectively be detected when performance issues involving components contained with the enclosure, e.g., a compute system, are identified.

In a step 1313, a maintenance check may be performed on the enclosure. Performing a maintenance check may include, but is not limited to including, determining whether seals on the enclosure are compromised. Checking the seals may involve pressure checks to determine if there is leakage associated with the seals.

A determination is made in a step 1317 as to whether the enclosure has passed the maintenance check. If the determination is that the enclosure has passed the maintenance check, the indication is that condensation is likely not due to physical issues with the enclosure such as compromised seals. Rather, the implication may be that the temperature of coolant in a cooling arrangement is at or below a dew point. As such, in a step 1321, a set point for coolant is adjusted. For example, the set point temperature for the coolant may be increased. In general, the set point may be adjusted such that the coolant may be provided at a temperature that is above the dew point.

Once the set point for the coolant is adjusted, the enclosure is subjected to operating conditions in a step 1325. That is, the enclosure is effectively tested, e.g., stress tested, in an environment in which enclosure will be placed to determine whether measures taken such as adjusting the set point for the coolant have alleviated the condensation issues detected in step 1309.

A determination is made in a step 1329 as to whether the enclosure has passed the testing, or otherwise responded favorably to being subjected to operating conditions. If the determination is that the enclosure has not passed the testing, process flow returns to step 1313 in which a maintenance check is performed on the enclosure. Alternatively, if the determination is that the enclosure has passed the testing, then the method of addressing condensation issues is completed.

Returning to step 1317 and the determination of whether the enclosure has passed the maintenance check, if it is determined that the enclosure has not passed the maintenance check, then process flow moves to a step 1333 in which adjustments to the enclosure are made based on issues identified during the maintenance check of step 1313. For example, seals may be fixed of the seals were determined to leak. From step 1333, process flow proceeds to step 1325 in which the enclosure is subjected to operating conditions.

Figure 14:
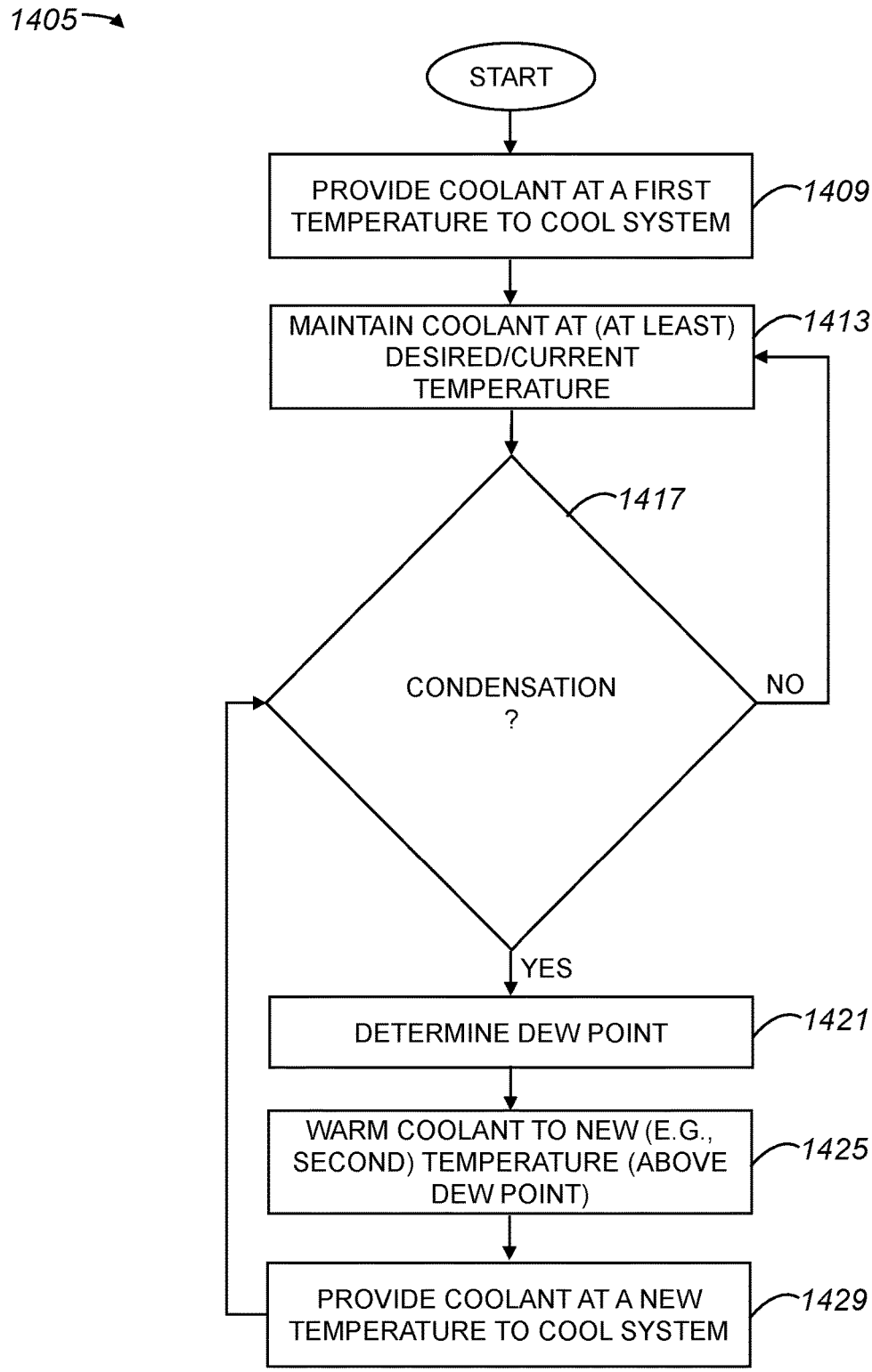
FIG. 14 is a process flow diagram which illustrates a method of adjusting a temperature of a coolant of a cooling arrangement in accordance with an embodiment.

The temperature of a coolant or a cooling device of a cooling arrangement may be adjusted substantially dynamically, as for example when an autonomous vehicle that includes the cooling arrangement is in use. By substantially dynamically adjusting the temperature of a coolant, condensation may be mitigated. FIG. 14 is a process flow diagram which illustrates a method of adjusting a temperature of a coolant of a cooling arrangement in an autonomous vehicle in accordance with an embodiment. A method 1405 of adjusting a temperature of a coolant of a cooling arrangement begins at a step 1409 in which a coolant at a first temperature is provided to cool a system, e.g., a compute system in an enclosure on an autonomous vehicle. The first temperature may be any suitable temperature, as for example a temperature that is above an expected dew point.

The coolant is maintained at or above the first temperature, or more generally, a desired temperature, at a step 1413. To maintain the coolant provided for cooling purposes at or above a first temperature, for example, coolant may be warmed or cooled as needed. Warming the coolant may include mixing coolant with additional coolant which has absorbed heat through a heat transfer process involving the system, while cooling the coolant may include mixing coolant with additional coolant from a reservoir. While warming the coolant may include adding an amount of warmed coolant to an amount of unwarmed coolant obtained from a reservoir, warming the coolant may instead or also include, but is not limited to including, applying heat to the coolant using a heat source such as a heater.

A determination is made in a step 1417 as to whether condensation is detected in and/or around the system. If no condensation is detected in the system, the indication is that the desired temperature of the coolant is above a dew point. As such, process flow returns to step 1413 in which the coolant continues to be maintained at a desired temperature, e.g., the first temperature.

Alternatively, if the determination in step 1417 is that condensation has been detected, the implication is that the temperature of the coolant is relatively low compared to a dew point, i.e., at or below the dew point. Accordingly, in a step 1421, a dew point is determined. Determining the dew point may include, but is not limited to including, taking measurements of the environment around the system to determine humidity levels and/or water vapor levels.

After the dew point is determined, the coolant is warmed to a new, e.g., second, temperature in a step 1425. The new desired temperature may generally be a temperature that is greater than the dew point. Warming the coolant may include providing the coolant, e.g., the coolant that is to be provided to cool the system, with warmed coolant which has already cooled the system by absorbing heat emanating from the system. In one embodiment, warming the coolant may include using a heat source such as a heater to warm the coolant.

Once the coolant is warmed to the new desired or new current temperature, the warmed coolant is provided to cool the system in a step 1429. Process flow then returns to step 1417 in which it is determined whether there is condensation in the system.

Although only a few embodiments have been described in this disclosure, it should be understood that the disclosure may be embodied in many other specific forms without departing from the spirit or the scope of the present disclosure. By way of example, an electronic enclosure may contain multiple systems which may benefit from cooling, and may be cooled by a heat exchanger system. That is, more than one heat load may be cooled using a single heat exchanger system. Alternatively, an electronic enclosure may include multiple heat exchanger systems arranged to cool one or more heat loads within the enclosure.

In one embodiment, a heat exchanger arrangement that is positioned substantially within an electronic enclosure may be used to provide heat within the enclosure. For example, some components may have a minimum temperature requirement, or a minimum temperature at which the components will perform per specifications. A heat exchanger arrangement may be used to provide heat within the enclosure that allows at least the minimum temperature, as for example a startup temperature, of the components to be reached. That is, when an environmental temperature is below a minimum operating temperature of a component within an electronic enclosure, a heat exchanger arrangement within the enclosure may be used to heat the air within the enclosure such that at least the minimum operating temperature is achieved within the enclosure.

A set point of a coolant may generally be set to be higher than substantially all known dew points, e.g., based on historical records. In one embodiment, a set point of a coolant may effectively be optimized such that the set point is closer to specific conditions within an overall system. It should be appreciated that effectively optimizing a set point may reduce power requirements of the overall system.

The systems described above may be implemented substantially independently or together. For instance, an autonomous vehicle may include a heat exchanger system within an electronic enclosure as well as a system which heat coolant to a temperature above a dew point. Further, the systems described above may generally be used in conjunction with other systems arranged to compensate for environmental effects. By way of example, a heat exchanger system may be used in addition to a dedicated heat sink positioned within an electronic enclosure without departing from the spirit or the scope of the disclosure.

In general, the internal air temperature in an electronic enclosure may be controlled with an internal radiator connected to an external liquid loop, as described above. Additional mechanisms which may be used to facilitate the control of an internal air temperature may include, but are not limited to including, a thermoelectric cooler such as a Peltier device, a heat sink mounted on a high power chip or component, and/or an internal fin structure used with or without a fan for forced convection.

To determine and to monitor the temperature of a coolant, various temperature sensors may be used. Temperatures sensors may be arranged to measure the temperature of a coolant before the coolant is provided to a plate, e.g., a cold plate, and the temperature of a coolant after the coolant is removed from the plate.

To provide additional protection from environmental concerns, membranes may be included in a cooling system to effectively serve as dehumidifiers. In addition, electronics enclosures may be sealed and pressurized to substantially prevent humidity from reaching electronics contained within the electronics enclosures. For example, an IP-67 seal may be used to seal an electronics enclosure and/or an overall chassis. Cooling may be provided within a sealed electronics enclosure using methods and systems described above.

An autonomous vehicle has generally been described as a land vehicle, or a vehicle that is arranged to be propelled or conveyed on land. It should be appreciated that in some embodiments, an autonomous vehicle may be configured for water travel, hover travel, and or/air travel without departing from the spirit or the scope of the present disclosure.

The embodiments may be implemented as hardware, firmware, and/or software logic embodied in a tangible, i.e., non-transitory, medium that, when executed, is operable to perform the various methods and processes described above. That is, the logic may be embodied as physical arrangements, modules, or components. For example, the systems of an autonomous vehicle, as described above with respect to FIG. 3, may include hardware, firmware, and/or software embodied on a tangible medium. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

The steps associated with the methods of the present disclosure may vary widely. Steps may be added, removed, altered, combined, and reordered without departing from the spirit of the scope of the present disclosure. By way of example, when condensation is detected, a coolant or a cooling device of a cooling arrangement may be heated to a temperature above a dew point. However, in one embodiment, after heating a coolant or cooling device, a determination may be made as to whether it is to lower the temperature of the coolant or cooling device in the event that the dew point has dropped. Therefore, the present examples are to be considered as illustrative and not restrictive, and the examples are not to be limited to the details given herein, but may be modified within the scope of the appended claims.

What is claimed is:

1. An apparatus comprising:
a first system, the first system configured to generate heat; and
a cooling arrangement, the cooling arrangement configured to cool the first system, the cooling arrangement including a coolant source and a distribution arrangement, the distribution arrangement including a cold plate, wherein the coolant source provides a coolant in a first state that is distributed by the distribution arrangement to absorb the heat, wherein when the coolant in the first state absorbs the heat as the coolant passes through the cold plate, the coolant is in a second state, and wherein the coolant in the second state is a warmed coolant, the cooling arrangement further including
a control arrangement and a heating arrangement, the control arrangement configured to maintain the coolant in the first state at least at a set point, the set point being a temperature that is above a dew point, by determining when to activate the heating arrangement to warm the coolant in the first state, wherein the heating arrangement is configured to add the warmed coolant into the coolant in the first state to maintain the coolant in the first state at the temperature that is above the dew point, and,
when it is determined by the control arrangement that the heating arrangement is to be activated, activating the heating arrangement to warm the coolant in the first state to maintain the temperature of the coolant at the set point.

2. The apparatus of claim 1 wherein the apparatus is a vehicle, the vehicle being configured to operate autonomously or semi-autonomously, and wherein the first system is a compute system.

3. The apparatus of claim 1 wherein the heating arrangement is configured to heat the coolant in the first state using a heater.

4. The apparatus of claim 1 wherein the set point is between twenty-one degrees Celsius (C) and thirty-two degrees C.

5. A vehicle comprising:
a chassis;
a first system, the first system carried on the chassis, the first system configured to enable the vehicle to operate autonomously, wherein the first system includes a compute system, the compute system being arranged to emanate heat; and
a cooling arrangement, the cooling arrangement carried on the chassis, the cooling arrangement including a reservoir, a heating arrangement, and a distribution arrangement, the reservoir being arranged to contain a liquid coolant; the heating arrangement being arranged to warm the liquid coolant to a set point temperature, wherein the set point temperature is above a dew point associated with an environment around the vehicle, and wherein the liquid coolant at the set point temperature is arranged to be distributed by the distribution arrangement to absorb the heat.

6. The vehicle of claim 5 wherein the liquid coolant is at the set point temperature before the liquid coolant absorbs the heat, and wherein the liquid coolant is at a first temperature after the liquid coolant absorbs the heat, the first temperature being higher than the set point temperature.

7. The vehicle of claim 6 wherein a first amount of the liquid coolant in the reservoir is at a second temperature, the second temperature being less than the set point temperature, and wherein the heating arrangement is configured to add a second amount of the liquid coolant at the first temperature to the first amount of the liquid coolant.

8. The vehicle of claim 7 further including a third amount of the liquid coolant at the set point temperature, wherein the heating arrangement is configured to add the second amount of the liquid coolant to the first amount of the liquid coolant to obtain the third amount of the liquid coolant at the set point temperature.

9. The vehicle of claim 5 wherein the cooling arrangement further includes a sensor arrangement, the sensor arrangement being configured to determine whether to adjust the set point temperature and to cause the control arrangement to adjust the set point temperature when it is determined that the set point temperature is to be adjusted.

10. The vehicle of claim 9 wherein the sensor arrangement is configured to determine whether to adjust the set point temperature by determining whether the dew point has changed.

11. A method comprising;
cooling a vehicle system, wherein cooling the vehicle system includes providing a coolant to a cooling arrangement, the cooling arrangement being arranged to provide the coolant at a set point temperature to cool the vehicle system, the set point temperature being above a dew point temperature associated with the vehicle system; and
maintaining the coolant at the set point temperature, wherein maintaining the coolant at the set point temperature includes determining when the coolant is to be warmed to maintain the coolant at the set point temperature;
warming the coolant to the set point temperature when it is determined that the coolant is to be warmed, wherein warming the coolant to the set point temperature creates at least a first amount of a warmed coolant; and
providing the first amount of the warmed coolant to the cooling arrangement to provide the cooling to the vehicle system after warming the coolant.

12. The method of claim 11 wherein the vehicle system emanates heat, wherein the coolant at the set point temperature is heated to a first temperature by the heat when the coolant at the set point temperature is provided to cool the vehicle system, the first temperature being higher than the set point temperature.

13. The method of claim 12 wherein warming the coolant to the set point temperature to create the first amount of the warmed coolant includes combining a second amount of coolant from a reservoir with a third amount of the coolant, the third amount of the coolant being at the first temperature, and wherein the reservoir is configured to provide the coolant to the coolant arrangement.

14. The method of claim 11 further including:
determining when to increase the set point temperature to a new set point temperature; and warming the coolant to the new set point temperature when it is determined that the set point temperature is to be increased.

15. The method of claim 11 further including:
determining whether condensation is detected in the vehicle system;
increasing the set point temperature to a new set point temperature when it is determined that condensation is detected in the vehicle system; and
warming the coolant to the new set point temperature.

16. The method of claim 15 further including:
determining a new dew point temperature when it is determined that condensation is detected in the vehicle system, wherein the new set point temperature is above the new dew point temperature.

17. The method of claim 11 wherein the vehicle system wherein warming the coolant to the set point temperature includes applying heat from a heat source to the coolant.

\* \* \* \* \*